US006995634B2

United States Patent
(12) United States Patent
Iwashita et al.

(10) Patent No.: US 6,995,634 B2
(45) Date of Patent: Feb. 7, 2006

(54) SURFACE-ACOUSTIC-WAVE COMPONENT ADAPTED TO ELECTRONIC CIRCUIT AND DEVICE, AND MANUFACTURING METHOD THEREFOR

(75) Inventors: Setsuya Iwashita, Nirasaki (JP); Takamitsu Higuchi, Matsumoto (JP); Hiromu Miyazawa, Toyoshima-machi (JP)

(73) Assignee: Seiko Epson Corporation, (JP)

( * ) Notice: Subject to any disclaimer, the term of this patent is extended or adjusted under 35 U.S.C. 154(b) by 49 days.

(21) Appl. No.: 10/753,237

(22) Filed: Jan. 7, 2004

(65) Prior Publication Data

US 2004/0189425 A1 Sep. 30, 2004

(30) Foreign Application Priority Data

Jan. 29, 2003 (JP) ............................ 2003-020803

(51) Int. Cl.
*H03H 9/64* (2006.01)
*H03B 5/36* (2006.01)

(52) U.S. Cl. .................. 333/193; 333/195; 310/313 A; 331/116 R; 331/107 A; 438/48; 438/458; 438/464; 438/149

(58) Field of Classification Search ........ 333/193–196; 310/313 A, 313 B, 313 D; 331/116 R, 107 A; 438/48, 458, 464, 149
See application file for complete search history.

(56) References Cited

U.S. PATENT DOCUMENTS 4,567,393 A * 1/1986 Asai et al. .............. 310/313 A
4,952,832 A * 8/1990 Imai et al. .............. 310/313 A
5,075,652 A * 12/1991 Sugai .......................... 33/193
5,426,340 A * 6/1995 Higaki et al. ........... 310/313 R
5,506,829 A * 4/1996 Yagi et al. .................. 369/126
5,576,589 A * 11/1996 Dreifus et al. .......... 310/313 A
6,515,334 B2 * 2/2003 Yamazaki et al. .......... 257/347
6,556,094 B2 * 4/2003 Hasegawa et al. .......... 331/158
6,593,679 B2 * 7/2003 Higuchi et al. ......... 310/313 A
6,630,767 B2 * 10/2003 Inoue et al. ............ 310/313 A
6,642,813 B1 * 11/2003 Itakura et al. .............. 333/193
6,710,513 B2 * 3/2004 Nakahata et al. ....... 310/313 A

FOREIGN PATENT DOCUMENTS

JP 01-103310 4/1989
JP 5-83078 * 4/1993 ................ 333/193
JP 5-90889 * 4/1993 ............ 310/313 A
JP 06-120416 4/1994

(Continued)

OTHER PUBLICATIONS

Shibata et al, Epitaxial growth and surface-acoustic-wave properties of LiTa03 films grown by pulsed laser deposition, Applied Physics Letters, vol. 62 (1993), pp. 3046-3048.

*Primary Examiner*—Barbara Summons
(74) *Attorney, Agent, or Firm*—Harness, Dickey & Pierce, P.L.C.

(57) ABSTRACT

A surface-acoustic-wave component that comprises a first piezoelectric layer composed of zinc oxide (ZnO), a second piezoelectric layer composed of lithium niobate ($LiNbO_3$), and a protective layer, which are sequentially formed on a silicon substrate, on which electrodes (e.g., interdigital transducers) are further formed. Alternatively, it comprises a conductive layer composed of zinc oxide (ZnO), a piezoelectric layer composed of lithium niobate ($LiNbO_3$), and a protective layer, which are sequentially formed on a silicon substrate, on which electrodes are further formed. The piezoelectric layer can actualize preferable orientation so as to improve the electromechanical coupling coefficient ($K^2$). Thus, it is possible to produce surface-acoustic-wave components that contribute to manufacturing of highly-integrated electronic circuits such as frequency filters and oscillators as well as electronic devices such as portable telephones.

29 Claims, 6 Drawing Sheets

FOREIGN PATENT DOCUMENTS

| | | | |
|---|---|---|---|
| JP | 07-050436 | | 2/1995 |
| JP | 11-026733 | | 1/1999 |
| JP | 2001-185975 | | 7/2001 |
| JP | 2002-57549 | * | 2/2002 |

* cited by examiner

SURFACE-ACOUSTIC-WAVE COMPONENT ADAPTED TO ELECTRONIC CIRCUIT AND DEVICE, AND MANUFACTURING METHOD THEREFOR

BACKGROUND OF THE INVENTION

1. Field of the Invention

This invention relates to surface-acoustic-wave (SAW) components, which are adapted to electronic circuits and devices such as filters and oscillators. In addition, this invention also relates to manufacturing methods of oscillators using surface-acoustic-wave components.

This application claims priority on Japanese Patent Application No. 2003-20803, the content of which is incorporated herein by reference.

2. Description of the Related Art

Recently, demands for developing surface-acoustic-wave components and electronic devices using them have been rapidly increased due to remarkable expansion and development of communication fields in mobile communications using cellular phones and the like. Surface-acoustic-wave components have been developed by using single crystals such as quartz crystals, whereas in consideration of recent progresses of electronic devices that are driven at higher frequencies and are produced using highly integrated semiconductor components, it is strongly demanded that surface-acoustic-wave components using piezoelectric thin films be further advanced.

Conventionally, various types of surface-acoustic-wave components using piezoelectric thin films have been developed. For example, Japanese Patent Application Publication No. Hei 7-50436 discloses an example of a surface-acoustic-wave component in which a zinc oxide (ZnO) piezoelectric crystal film is formed on a sapphire substrate; and Japanese Patent Application Publication No. Hei 1-103310 discloses an example of a surface-acoustic-wave component in which a piezoelectric film is formed on a diamond-like carbon film layer formed on a Si substrate. In addition, an example of a surface-acoustic-wave component in which a lithium niobate ($LiNbO_3$) thin film is formed on a sapphire substrate is disclosed in the monograph entitled 'Epitaxial growth and surface-acoustic-wave properties of $LiTaO_3$ films grown by pulsed laser deposition' published in Applied Physics Letters, Vol. 62 (1993), pp. 3046–3048.

Integrating the aforementioned surface-acoustic-wave components on silicon substrates together with semiconductor components is useful in reducing sizes of devices using surface-acoustic-wave components and in actualizing high performance in devices using surface-acoustic-wave components. For example, Japanese Patent Application Publication No. Hei 6-120416 discloses that a surface-acoustic-wave component comprising a single crystal is joined onto a silicon substrate forming a semiconductor component.

The conventional technology regarding the aforementioned surface-acoustic-wave components has the following drawbacks.

That is, when a zinc oxide thin film or a lithium niobate thin film is formed on a sapphire substrate, it is very difficult to form a semiconductor component such as a complementary metal-oxide semiconductor (CMOS) component on the sapphire substrate.

It may be possible to form a zinc oxide thin film on a silicon substrate; however, an electromechanical coupling coefficient (hereinafter, denoted as '$K^2$') of zinc oxide is very low. Therefore, when a surface-acoustic-wave component is adopted in a high-frequency filter, it may be ideal to use a prescribed material having a higher value of $K^2$ such as lithium tantalate ($LiTaO_3$) and lithium niobate ($LiNbO_3$) in order to produce a desired transmission band, i.e., a relatively broad frequency band; however, it is very difficult to form an orientation film having a good quality on the silicon substrate.

When a zinc oxide thin film is formed on a diamond-like carbon film formed on a silicon substrate, it is very difficult to form a semiconductor component on the diamond-like carbon film. Similar difficulty occurs even when a thin film composed of another material such as lithium niobate and lithium tantalate other than zinc oxide is formed.

When a surface-acoustic-wave component comprising a single crystal is joined onto a silicon substrate on which a semiconductor component is formed, there is a problem in that characteristics of the surface-acoustic-wave component are greatly influenced by cutting angles of a single crystal plate.

SUMMARY OF THE INVENTION

It is an object of the invention to provide a surface-acoustic-wave component having high performance formed on a substrate made of a prescribed material, which is not necessarily limited to silicon.

It is another object of the invention to provide an electronic device using the surface-acoustic-wave component, such as an oscillator, which can be integrated together with a semiconductor component.

First, this invention provides a surface-acoustic-wave component that comprises a first piezoelectric layer composed of zinc oxide (ZnO), a second piezoelectric layer composed of lithium niobate ($LiNbO_3$), and a protective layer composed of oxide or nitride, which are sequentially formed and laminated on a substrate, on which electrodes (e.g., interdigital transducers) are further formed. Alternatively, it comprises a conductive layer composed of zinc oxide (ZnO), a piezoelectric layer composed of lithium niobate ($LiNbO_3$), and a protective layer, which are sequentially formed and laminated on a substrate, on which electrodes are further formed. Incidentally, the substrate can be composed of silicon or other compound containing silicon.

The aforementioned structures allow the piezoelectric layer to have preferable orientation, regardless of the property of the piezoelectric layer that is hardly oriented to directly suit the material of the substrate. This allows the manufacturer to adequately select the preferred material for the piezoelectric layer, which contributes to an improvement of the electromechanical coupling coefficient ($K^2$). Thus, it is possible to produce the surface-acoustic-wave component having high performance.

Specifically, the piezoelectric layer can be composed of a prescribed material having the hexagonal crystal structure, which is selected from among zinc oxide (ZnO), aluminum nitride (AlN), lithium tantalate ($LiTaO_3$), lithium niobate ($LiNbO_3$), and other substances expressed in the chemical formula of $LiNb_{1-x}Ta_xO_3$ (where $0<x<1$).

Second, this invention provides a frequency filter comprising first and second electrodes, which are respectively formed on the piezoelectric layer or a protective layer formed on the piezoelectric layer of the aforementioned surface-acoustic-wave component, wherein surface acoustic waves occur in the piezoelectric layer in response to electric signals applied to the first electrode, so that the second electrode converts them into electric signals while resonating at a specific frequency or in a specific frequency band.

Third, this invention provides an oscillator comprising first and second electrodes, which are respectively formed on the piezoelectric layer or a protective layer formed on the piezoelectric layer of the aforementioned surface-acoustic-wave component, as well as an oscillation circuit comprising thin-film transistors (TFTs), wherein electric signals applied to the first electrode cause surface acoustic waves in the piezoelectric layer, and the second electrode resonates with surface acoustic waves at a specific frequency or in a specific frequency band.

Fourth, this invention provides an electronic circuit comprising the aforementioned oscillator and an electrode for receiving electric signals from an electric signal providing element. This electronic circuit can actualize various functions, in which specific frequency components are selected from electric signals, electric signals are converted to specific frequency components, electric signals are adequately modulated or demodulated, and electric signals having a specific frequency or a specific frequency band are detected, for example.

Fifth, this invention provides an electronic device comprising at least one of the aforementioned frequency filter, oscillator, and electronic circuit. Since the piezoelectric layer of the surface-acoustic-wave component has a relatively high electromechanical coupling coefficient, it is possible to provide a small-size and high-performance electronic device.

Sixth, this invention provides a manufacturing method of the aforementioned oscillator comprising the surface-acoustic-wave component and oscillation circuit. This manufacturing method comprises three steps, wherein the surface-acoustic-wave component is formed on a first substrate; thin-film transistors (TFTs) are formed on a second substrate; and thin-film transistors are transferred onto the first substrate so as to form the oscillation circuit.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

This invention will be described in further detail by way of examples with reference to the accompanying drawings.

Hereinafter, various embodiments regarding surface-acoustic-wave components, frequency filters, oscillators and their manufacturing methods, and electronic circuits and devices will be described with reference to FIGS. 1–4, FIGS. 5A and 5B, and FIGS. 6–9, in which structures and exterior appearances are roughly illustrated in order to show materials and members in visible sizes and scales, so that for the sake of convenience, some materials and members are drawn at different scales.

1. First Embodiment

Figure 1:
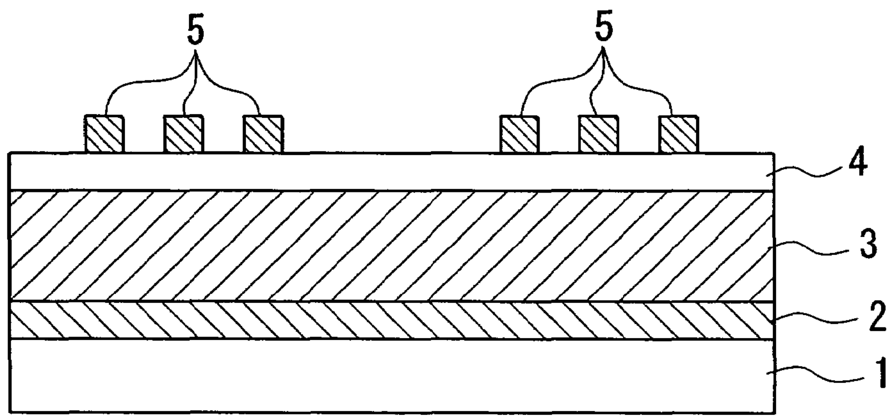
FIG. 1 is a cross sectional view showing the internal structure of a surface-acoustic-wave component in accordance with a first embodiment of the invention.

FIG. 1 is a cross sectional view showing the internal structure of a surface-acoustic-wave component in accordance with a first embodiment of the invention.

The surface-acoustic-wave component of FIG. 1 comprises a silicon substrate (hereinafter, simply referred to as a Si substrate) 1, a first piezoelectric layer (i.e., a piezoelectric thin layer) 2, a second piezoelectric layer 3, a protective layer 4 composed of a prescribed oxide or a prescribed nitride, and electrodes 5. Viewing from the upper side, the electrodes 5 have prescribed shapes and patterns, which correspond to interdigital transducer electrodes (hereinafter, simply referred to as IDT electrodes) 41, 42, 51, 52, and 53 shown in FIGS. 3 and 4, for example.

Next, a description will be given with respect to a manufacturing method of the surface-acoustic-wave component of the first embodiment having the aforementioned structure.

As the first piezoelectric layer 2, a zinc oxide (ZnO) thin film having a hexagonal crystal structure is formed on the Si substrate 1 by using a laser ablation method. Herein, a ZnO ceramic to which lithium (Li) is added at 10 mol % is used as a target material. This compensates for oxygen deficiency in the ZnO thin film, thus actualizing a piezoelectric layer having good characteristics. In addition, the ZnO thin film is formed under conditions in which oxygen pressure is set to 13 Pa (0.1 Torr), and substrate temperature is set to 500° C., whereby the ZnO thin film has an orientation in a vertical direction relative to the surface of the Si substrate. It is preferable that the thickness of the ZnO thin film be as small as possible; in particular, the thickness of the ZnO thin film is preferably set to 100 nm or so. In general, ZnO has a prescribed property in which the orientation thereof does not depend upon orientation of the surface of a base material therefor but in which the orientation thereof is easy to be established in (001) direction which is normal to the surface therefor. Therefore, by adequately adjusting conditions regarding film formation, it becomes possible to establish the orientation of the ZnO thin film in (001) direction which is normal to any type of the base material surface therefor other than the Si substrate, such as an amorphous (or noncrystal) silicon oxide ($SiO_2$) film. Incidentally, the oxygen pressure and the substrate temperature are not necessarily set to the aforementioned values, and the forming method of the ZnO thin film is not necessarily limited to the aforementioned laser ablation method.

Next, as the second piezoelectric layer 3, a lithium niobate ($LiNbO_3$) thin film having a hexagonal crystal structure is formed on the first piezoelectric layer 2 by using the laser ablation method. It is formed under conditions in which oxygen pressure is set to 1.3 Pa (0.01 Torr), and substrate temperature is set to 500° C., whereby the orientation of the ZnO thin film may cause the $LiNbO_3$ thin film to have an orientation in (001) direction which is normal to the surface of the first piezoelectric layer 2. It is preferable that the thickness of the $LiNbO_3$ thin film be as large as possible; in particular, the thickness of the $LiNbO_3$ thin film is preferably set to 1 $\mu$m or so.

Next, as the protective layer 4, a $SiO_2$ thin film is formed on the second piezoelectric layer 3 by using the laser ablation method. The protective layer 4 is formed for the purpose of protection of the layer formed thereunder not to be mixed with water content and impurities. Therefore, the material of the protective layer 4 is not necessarily limited to $SiO_2$ as long as the aforementioned purpose is satisfied.

Next, an aluminum (Al) thin film is formed on the protective layer 4 and is then subjected to patterning, thus forming the electrodes 5 having the prescribed shapes and patterns.

In the above, the $LiNbO_3$ thin film and the Si substrate 1 mutually differ from each other in crystal structure and lattice constant thereof, whereby when the $LiNbO_3$ thin film is directly formed on the Si substrate 1, mutual diffusion occurs so as to cause difficulties in establishing prescribed orientations therefor. The present embodiment is characterized by forming the first piezoelectric layer (i.e., the ZnO thin film) 2 as the buffer layer intervening between the Si substrate 1 and the second piezoelectric layer (i.e., $LiNbO_3$ thin film). This allows the piezoelectric layer composed of $LiNbO_3$ to be formed on or above the Si substrate 1. Herein, a measurement result regarding the surface-acoustic-wave component of the present embodiment shows that its $K^2$ value is 3%.

Since the ZnO thin film is used as the first piezoelectric layer 2, the material of the second piezoelectric layer 3 is not necessarily limited to $LiNbO_3$. That is, it is possible to use any material having the hexagonal crystal structure, such as aluminum nitride (AlN), and lithium tantalate ($LiTaO_3$), and $LiNb_{1-x}Ta_xO_3$ (where $0<x<1$), for example. In particular, AlN brings a high sound velocity in transmission; therefore, it is preferable for use in surface-acoustic-wave components operating at higher frequencies.

The present embodiment uses Si as the material of the substrate 1; however, the material is not necessarily limited to Si. That is, it is preferable to use various types of substrates, in which an amorphous layer composed of $SiO_2$ and the like is formed on the Si substrate, in which a diamond-like carbon film is formed on the Si substrate, and in which a prescribed film composed of silicon nitride ($Si_3N_4$) or silicon carbide (SiC) is formed on the Si substrate, for example. In general, the Si substrate is inexpensive and is preferable in mass production, and the piezoelectric layer can be formed on the amorphous layer composed of $SiO_2$ and the like. This indicates that the piezoelectric thin film can be formed on the protective layer (i.e., $SiO_2$ film) of the substrate on which semiconductor components are formed. In addition, it is possible to form the piezoelectric layer 2 on the Si substrate on which the diamond-like carbon film or the other film composed of $Si_3N_4$ or SiC is formed. Thus, even when the piezoelectric layer composed of $LiNbO_3$ or $LiTaO_3$ is formed, it is possible to produce surface-acoustic-wave components operating at higher frequencies.

2. Second Embodiment

Figure 2:
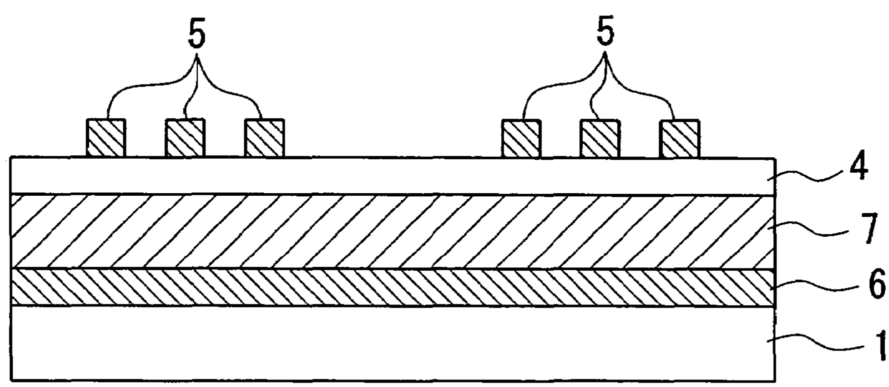
FIG. 2 is a cross sectional view showing the internal structure of a surface-acoustic-wave component in accordance with a second embodiment of the invention.

FIG. 2 is a cross sectional view showing the internal structure of a surface-acoustic-wave component in accordance with a second embodiment of the invention, wherein parts and layers identical to those shown in FIG. 1 are designated by the same reference numerals; hence, the detailed description thereof will be omitted as necessary.

The surface-acoustic-wave component of the second embodiment is basically similar to the surface-acoustic-wave component, whereas the second embodiment uses the ZnO thin film, which is used as the first piezoelectric layer 2 in the first embodiment, as a conductive layer 6 as shown in FIG. 2.

The manufacturing method of the surface-acoustic-wave component of the second embodiment differs from that of the first embodiment in conditions regarding formation of the ZnO thin film, which is formed as the conductive layer 6.

That is, the ZnO thin film is formed as the conductive layer 6 on the Si substrate by using the laser ablation method, wherein ZnO ceramics is used as the target material therefor. It is formed under conditions in which oxygen pressure is set to 1.3 Pa (0.01 Torr) or less, and substrate temperature is set to 500° C., whereby oxygen deficiency occurs remarkably so as to contribute to the formation of a conductive film of an electronic carrier type.

Similar to the first embodiment, a piezoelectric layer 7 made of a $LiNbO_3$ thin film is formed on the conductive layer 6.

As described above, the second embodiment is characterized by forming the conductive layer (i.e., ZnO thin film) 6 as the buffer layer intervening between the Si substrate 1 and the piezoelectric layer 7. This allows the piezoelectric layer composed of $LiNbO_3$ to be on or above the Si substrate 1 similarly to the first embodiment. Therefore, even when the thickness of the piezoelectric layer 7 is reduced compared with the thickness of the second piezoelectric layer 3 used in the first embodiment and is set to 500 nm, for example, it is possible to reliably set the $K^2$ value to 3%. That is, it is possible to realize the reduction of time for forming the surface-acoustic-wave component and the reduction of the amount of material used for forming the thin film.

3. Third Embodiment

Figure 3:
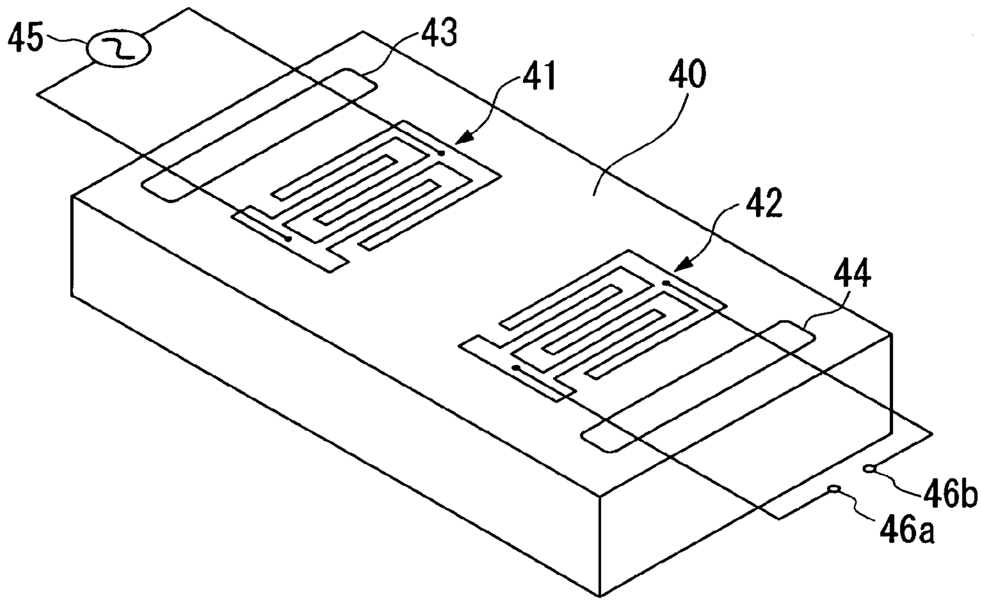
FIG. 3 is a perspective view showing the exterior appearance of a frequency filter in accordance with a third embodiment of the invention.

FIG. 3 is a perspective view showing the exterior appearance of a frequency filter adopting the aforementioned structure of the surface-acoustic-wave component in accordance with a third embodiment of the invention.

As shown in FIG. 3, the frequency filter has a substrate 40. As the substrate 40, it is possible to use the laminated structure of the first embodiment shown in FIG. 1, in which the first piezoelectric layer (i.e., ZnO thin film) 2, the second piezoelectric layer (i.e., $LiNbO_3$ thin film) 3, and the protective layer (i.e., $SiO_2$ thin film) are sequentially formed on the Si substrate 1, or the laminated structure of the second embodiment shown in FIG. 2 in which the conductive layer (i.e., ZnO thin film) 6, the piezoelectric layer (i.e., $LiNbO_3$ thin film) 7, and the protective layer (i.e., $SiO_2$ thin film) 4 are sequentially formed on the Si substrate 1.

In addition, IDT electrodes 41 and 42 are formed on the upper surface of the substrate 40, wherein they are formed using aluminum (Al) or an aluminum alloy (Al alloy), and their thickness is approximately set to one hundredth (1/100) the pitches of the IDT electrodes 41 and 42 respectively.

Furthermore, sound absorbers 43 and 44 are formed on the upper surface of the substrate 40 at prescribed positions sandwiching the IDT electrodes 41 and 42. They are arranged for the purpose of absorption of surface acoustic waves propagating on the surface of the substrate 40. A high-frequency signal source 45 is connected to the IDT electrode 41, and signal lines are connected to the IDT electrode 42.

In the above, the high-frequency signal source 45 outputs a high-frequency signal, which is applied to the IDT electrode 41, so as to cause surface acoustic waves on the upper surface of the substrate 40. Surface acoustic waves propagate on the upper surface of the substrate 40 approximately at a velocity of 5000 m/s. Surface acoustic waves propagating from the IDT electrode 41 to the sound absorber 43 are absorbed by the sound absorber 43. Within surface acoustic waves propagated to the IDT electrode 42, surface acoustic waves having a specific frequency or a specific frequency band, which depends upon the pitch of the IDT electrode 42, are converted into electric signals, which are extracted via terminals 46*a* and 46*b*. Incidentally, other frequency components of surface acoustic waves, which do not match the specific frequency or the specific frequency band, may mostly pass through the IDT electrode 42 and are absorbed by the sound absorber 44. Thus, it is possible to actualize extraction (or filtering) on surface acoustic waves of the specific frequency or specific frequency band within surface acoustic waves corresponding to electric signals supplied to the IDT electrode 41.

4. Fourth Embodiment

Figure 4:
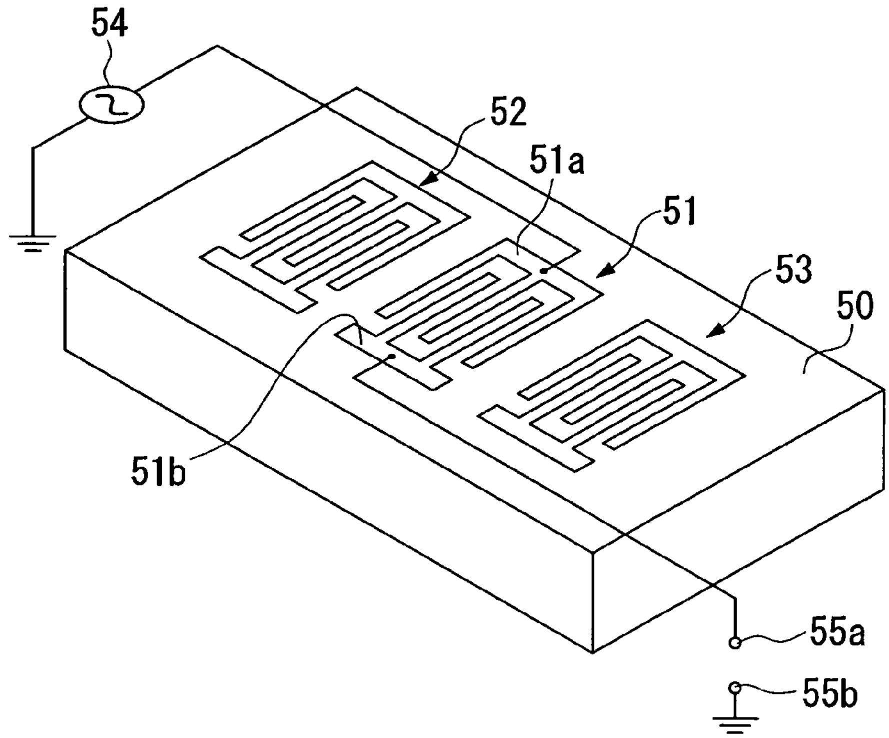
FIG. 4 is a perspective view showing the exterior appearance of an oscillator in accordance with a fourth embodiment of the invention.

FIG. 4 is a perspective view showing the exterior appearance of an oscillator adopting the aforementioned structure of the surface-acoustic-wave component in accordance with a fourth embodiment of the invention.

As shown in FIG. 4, the oscillator has a substrate 50. As the substrate 50, it is possible to use the laminated structure of the first embodiment shown in FIG. 1, in which the first piezoelectric layer (i.e., ZnO thin film) 2, the second piezoelectric layer (i.e., $LiNbO_3$ thin film), and the protective layer (i.e., $SiO_2$ thin film) 4 are sequentially formed on the Si substrate 1, or the laminated structure of the second embodiment shown in FIG. 2 in which the conductive layer (i.e., ZnO thin film) 6, the piezoelectric layer (i.e., $LiNbO_3$ thin film) 7, and the protective layer (i.e., $SiO_2$ thin film) 4 are sequentially formed on the Si substrate 1.

An IDT electrode 51 is formed approximately at the center of the upper surface of the substrate 50. In addition, IDT electrodes 52 and 53 are formed on the upper surface of the substrate 50 at prescribed positions sandwiching the IDT electrode 51. All of the IDT electrodes 51 to 53 are made of aluminum (Al) or an aluminum alloy (Al alloy), and their thickness is approximately set to one hundredth (1/100) the pitches of the IDT electrodes 51 to 53 respectively. The IDT electrode 51 is constituted by a pair of comb-like electrodes 51*a* and 51*b*, wherein the electrode 51*a* is connected with a high-frequency signal source 54, and the other electrode 51*b* is connected with a signal line. The IDT electrode 51 serves as an electric signal applied electrode, while the other IDT electrodes 52 and 53 serve as resonating electrodes causing resonation on specific frequency components of surface acoustic waves having a specific frequency or a specific frequency band within surface acoustic waves caused by the IDT electrode 51.

In the above, the high-frequency signal source 54 outputs a high-frequency signal, which is applied to the comb-like electrode 51*a* of the IDT electrode 51, so as to cause surface acoustic waves propagating to the IDT electrode 52 and the IDT electrode 53 respectively on the upper surface of the substrate 50. Herein, surface acoustic waves may propagate approximately at a velocity of 5000 m/s. Surface acoustic waves of specific frequency components are reflected by the IDT electrode 52 and the IDT electrode 53 respectively, thus causing standing waves between the IDT electrodes 52 and 53. Upon repetition of reflection of surface acoustic waves of specific frequency components by the IDT electrodes 52 and 53, specific frequency components (or frequency components of a specific frequency band) are resonated and are increased in amplitudes. A part of surface acoustic waves corresponding to the specific frequency or the specific frequency band is extracted by the comb-like electrode 51*b* of the IDT electrode 51. Thus, it is possible to extract electric signals of a certain frequency (or a certain frequency band) in response to the resonance frequency occurring between the IDT electrode 52 and the IDT electrode 53.

Figure 5A:
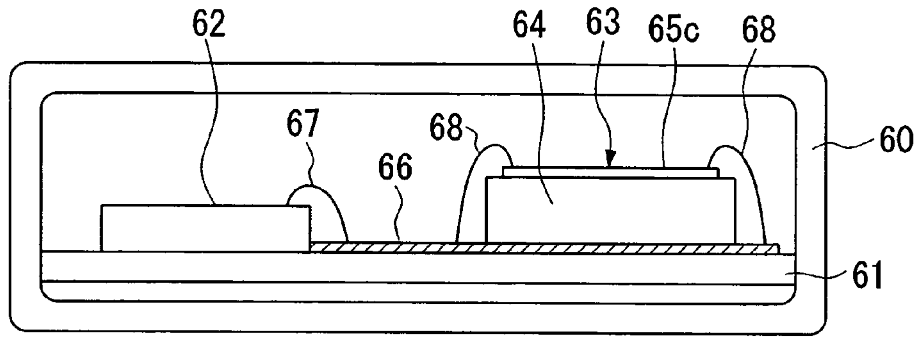
FIG. 5A is a side view in perspective, which shows the constitution of a voltage-controlled-surface-acoustic-wave oscillator using the oscillator shown in FIG. 4.
Figure 5B:
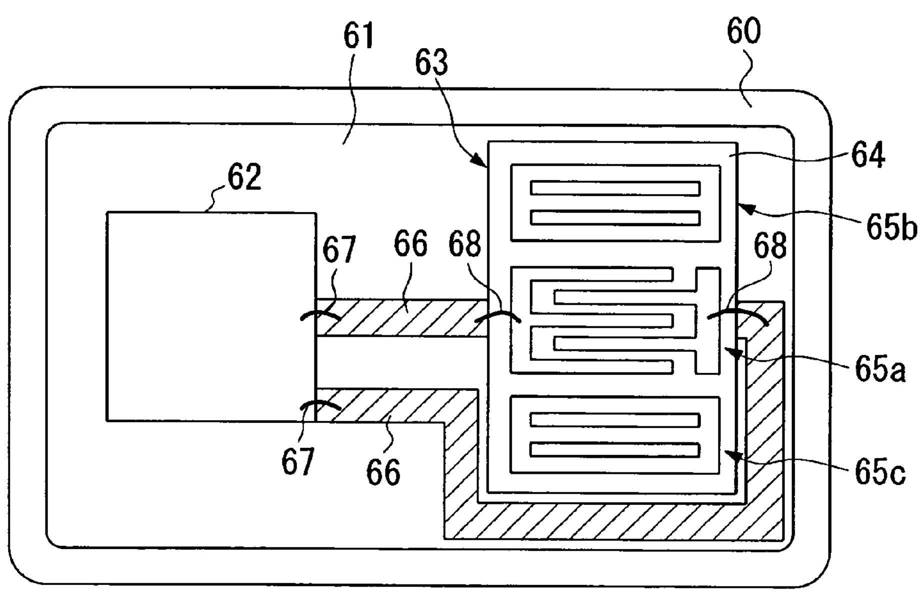
FIG. 5B is a plan view in perspective, which shows connections established between parts of the voltage-controlled-surface-acoustic-wave oscillator shown in FIG. 5A.

FIGS. 5A and 5B show a voltage-controlled-surface-acoustic-wave oscillator (i.e., VCSO) using the surface-acoustic-wave component of the fourth embodiment, wherein FIG. 5A is a side view in perspective, and FIG. 5B is a plan view in perspective.

The VCSO is arranged inside of a housing (or casing) 60 made of a metal (e.g., aluminum or stainless steel). An integrated circuit (IC) 62 and an oscillator 63 are formed and mounted on a substrate 61. The IC 62 forms an oscillation circuit that controls a frequency applied to the oscillator 63 in response to a voltage value input thereto from an external circuit (not shown).

The oscillator 63 comprises IDT electrodes 65*a*, 65*b*, and 65*c* formed on a substrate 64, the constitution of which is basically identical to that of the aforementioned oscillator shown in FIG. 4. As the substrate 64, it is possible to use the laminated structure of the first embodiment shown in FIG. 1, in which the first piezoelectric layer (i.e., ZnO thin film) 2, the second piezoelectric layer (i.e., $LiNbO_3$ thin film) 3, and the protective layer (i.e., $SiO_2$ thin film) 4 are sequentially formed on the Si substrate 1, or the laminated structure of the second embodiment shown in FIG. 2 in which the conductive layer (i.e., ZnO thin film) 6, the piezoelectric layer (i.e., $LiNbO_3$ thin film) 7, and the protective layer (i.e., $SiO_2$ thin film) 4 are sequentially formed on the Si substrate 1.

Wires 66 are formed and patterned to establish electrical connections between the IC 62 and the oscillator 63 on the substrate 61. In addition, the IC 62 and the wires 66 are connected together via metal wires 67 and the like, and the oscillator 63 and the wires 66 are connected together via metal wires 68 and the like. Thus, it is possible to securely establish electrical connections between the IC 62 and the oscillator 63 via the wires 66.

The aforementioned VCSO can be modified in such a way that both of the IC 62 and the oscillator (comprising the surface-acoustic-wave component) 63 are integrated and formed on the same substrate.

Figure 6:
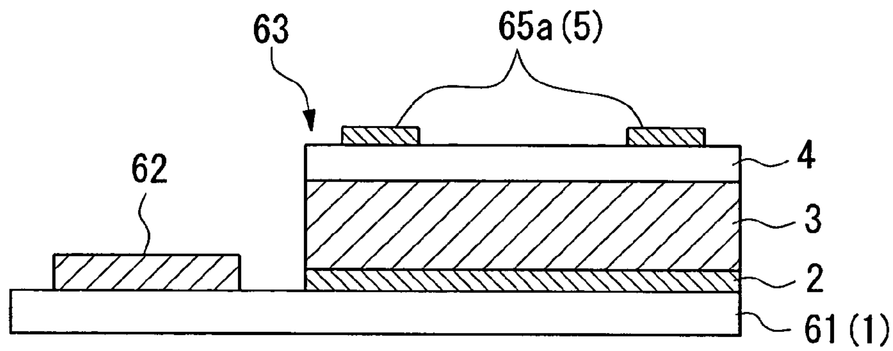
FIG. 6 is a side view partly in cross section, which shows the constitution of a modified example of the voltage-controlled-surface-acoustic-wave oscillator shown in FIG. 5A.

FIG. 6 shows such an example of the VCSO in which both of the IC 62 and the oscillator 63 are integrated, wherein the oscillator 63 has the same constitution of the surface-acoustic-wave component of the first embodiment, and wherein parts and layers identical to those shown in FIG. 1 and FIGS. 5A and 5B are designated by the same reference numerals; hence, the description thereof will be omitted as necessary.

The VCSO of FIG. 6 is designed such that both of the IC 62 and the oscillator 63 commonly share a silicon (Si) substrate 61 (corresponding to the aforementioned Si substrate 1). The oscillator 63 comprises electrodes 65*a* (corresponding to the aforementioned electrodes 5) that are electrically connected with the IC 62, details of which are not shown. The present embodiment particularly uses thin-film transistors (TFTs), which serve as transistors constituting the IC 62. This may eliminate the necessity of using silicon (Si) as the material of the substrate 61. Because, these transistors can be formed on any type of the substrate, in which a diamond-like carbon film is formed on the Si substrate, and in which a prescribed film composed of $Si_3N_4$ or SiC is formed on the substrate. That is, it becomes possible to design various types of constitutions in consideration of uses of oscillators, which are used for the VCSO and the like.

Because of the use of thin-film transistors (TFTs) as transistors constituting the IC 62, in the present embodiment, the oscillator (comprising the surface-acoustic-wave component) 63 is firstly formed on the Si substrate (or a primary substrate) 61; then, TFTs are formed on a secondary substrate are transferred onto the Si substrate 61 so that they are integrated together with the oscillator 63. Thus, even though it is difficult to directly form TFTs on the substrate or the substrate is composed of a certain material not suited to formation of TFTs thereon, the present embodiment guarantees the reliable formation of transistors on the substrate by use of the aforementioned transfer method. It is possible to adopt various methods in the transfer; in particular, it is preferable to use a transfer method disclosed in Japanese Patent Application Publication No. Hei 11-26733.

Each of the VCSO shown in FIGS. 5A and 5B and the VCSO shown in FIG. 6 can be used as a voltage-controlled oscillator (VCO) adapted to a phase-locked loop (PLL) circuit shown in FIG. 7, which will be briefly described below.

Figure 7:
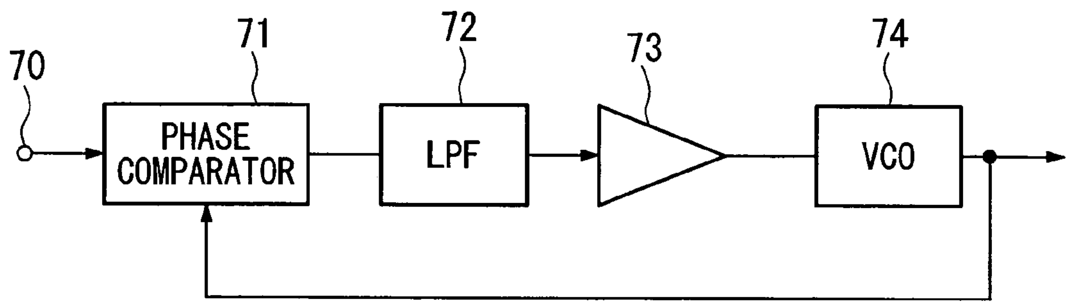
FIG. 7 is a block diagram showing the basic constitution of a phase-locked-loop circuit using the voltage-controlled-surface-acoustic-wave oscillator.

FIG. 7 is a block diagram showing the basic constitution of the PLL circuit.

That is, the PLL circuit of FIG. 7 comprises a phase comparator 71, a low-pass filter (LPF) 72, an amplifier 73, and a voltage-controlled oscillator (VCO) 74. The phase comparator 71 compares the phase (or frequency) of an input signal applied to an input terminal 70 with the phase (or frequency) of an output signal of the VCO 74 so as to produce a difference voltage signal, the value of which is set in response to the difference between them. The LPF 72 allows transmission of low-frequency components relative to the difference voltage signal output from the phase comparator 71. The amplifier 73 amplifies an output signal of the LPF 72. The VCO 74 is constituted as an oscillation circuit whose oscillating frequency continuously varies within a certain range of frequencies in response to a voltage value input thereto. The PLL circuit as a whole operates to reduce the difference between the input signal applied to the input terminal 70 and the output signal of the VCO 74 in phase (or frequency), so that the frequency of the output signal of the VCO 74 is being synchronized with the frequency of the input signal of the input terminal 70. Once the frequency of the output signal of the VCO 74 is synchronized with the frequency of the frequency of the input signal of the input terminal 70, it may substantially match the input signal of the input terminal 70, regardless of a certain phase difference therebetween. Thus, the PLL circuit outputs a signal to follow up with variations of the input signal.

5. Fifth Embodiment

Figure 8:
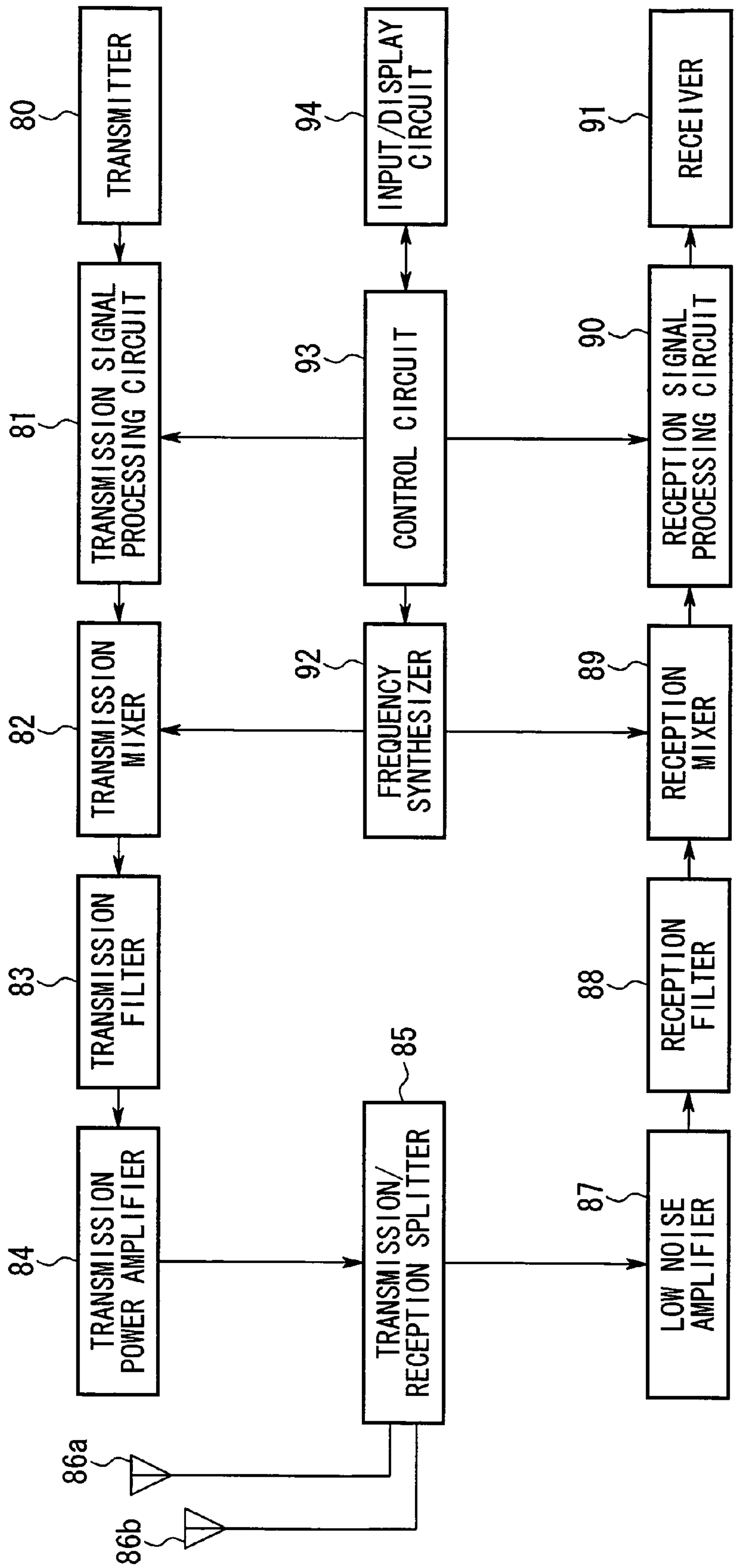
FIG. 8 is a block diagram showing the constitution of an electronic circuit in accordance with a fifth embodiment of the invention.

FIG. 8 is a block diagram showing the electrical constitution of an electronic circuit in accordance with a fifth embodiment of the invention.

Figure 9:
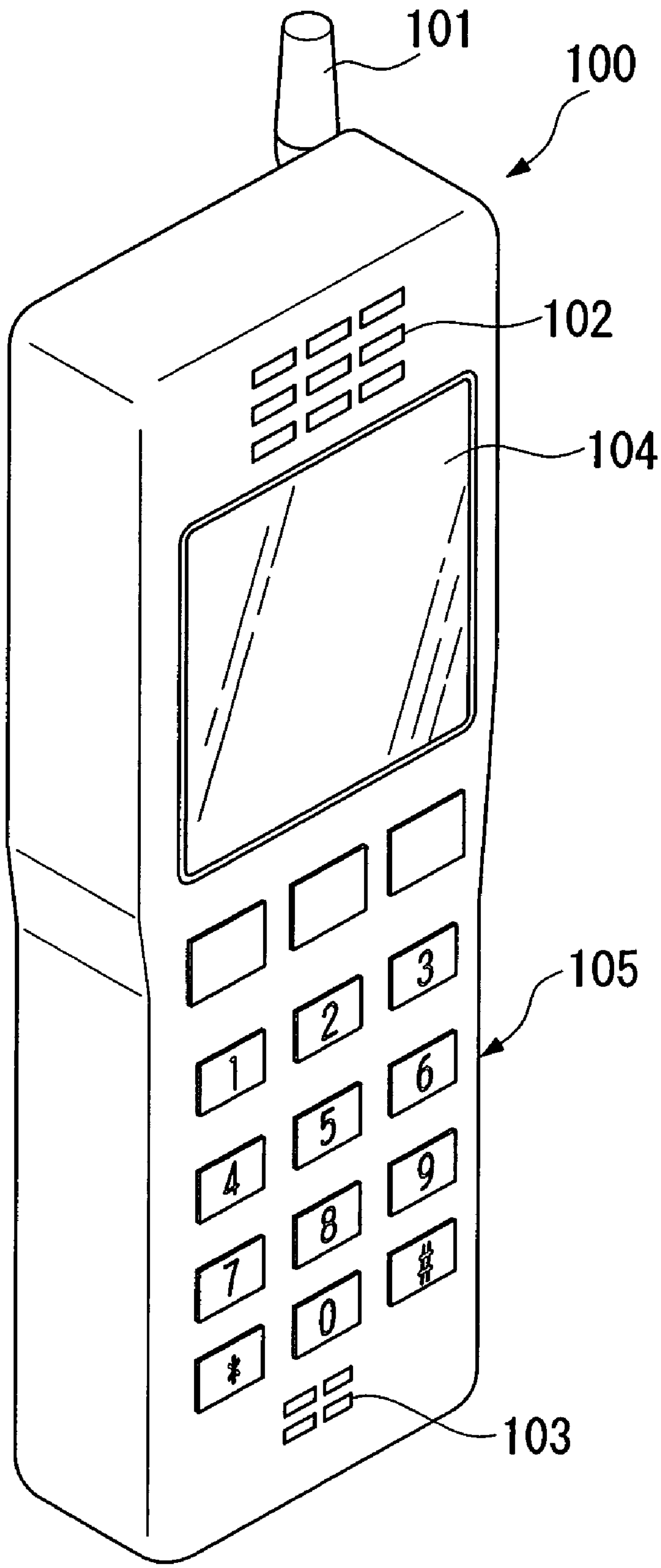
FIG. 9 is a perspective view showing the exterior appearance of a portable telephone incorporating the electronic circuit of FIG. 8.

The electronic circuit of FIG. 8 is arranged inside of a portable telephone (or a cellular phone) 100 shown in FIG. 9.

FIG. 9 is a perspective view showing the exterior appearance of the portable telephone, which serves as an example of an electronic device in accordance with the fifth embodiment.

The portable telephone 100 comprises an antenna 101, a receiver 102, a transmitter 103, a liquid crystal display 104, and keypads (or push buttons) 105.

FIG. 8 shows the basic constitution of the electronic circuit arranged inside of the portable telephone 100 shown in FIG. 9. Specifically, the electronic circuit of FIG. 8 comprises a transmitter 80, a transmission signal processing circuit 81, a transmission mixer 82, a transmission filter 83, a transmission power amplifier 84, a transmission/reception splitter 85, antennas 86*a* and 86*b*, a low noise amplifier 87, a reception filter 88, a reception mixer 89, a reception signal processing circuit 90, a receiver 91, a frequency synthesizer 92, a control circuit 93, and an input/display circuit 94. Incidentally, portable telephones (or cellular phones) that are recently made to fit for practical uses are designed to perform frequency conversion processes multiple times; therefore, electronic circuit constitutions therefor are further complicated compared with the electronic circuit of FIG. 8.

The transmitter 80 is actualized by a microphone that transduces sound waves into electric signals, for example. It corresponds to the transmitter 103 built in the cellular phone 100 shown in FIG. 9. The transmission signal processing circuit 81 performs prescribed processing such as digital-to-analog conversion and modulation processing on electric signals output from the transmitter 80. The transmission mixer 82 performs mixing, using an output signal of the frequency synthesizer 92, on an output signal of the transmission signal processing circuit 81. Herein, the frequency of the signal supplied to the transmission mixer 82 from the frequency synthesizer 92 is approximately set to 380 MHz, for example. The transmission filter 83 only allows transmission of certain frequency components of signals substantially matching the intermediate frequency (IF) therethrough while cutting out unwanted frequency components of signals. In addition, a conversion circuit (not shown) is arranged to convert an output signal of the transmission filter 83 into a radio-frequency (RF) signal, the frequency of which is approximately set to 1.9 GHz, for example. The transmission power amplifier 84 amplifies the power of the RF signal output from the transmission filter 83 via the aforementioned conversion circuit. Then, an output signal of the transmission power amplifier 84 is sent to the transmission/reception splitter 85.

The transmission/reception splitter 85 supplies the RF signal, which is output from the transmission power amplifier 84, to the antennas 86*a* and 86*b*, via which radio waves are transmitted. On the other hand, received signals received by the antennas 86*a* and 86*b* are detected by the transmission/reception splitter 85 and are delivered to the low noise amplifier 87. Herein, the frequency of the received signal output from the transmission/reception splitter 85 is approximately set to 2.1 GHz, for example. The low noise amplifier 87 amplifies the received signal supplied thereto from the transmission/reception splitter 85. In addition, a conversion circuit (not shown) is arranged to convert an output signal of the low noise amplifier 87 into an intermediate-frequency (IF) signal.

The reception filter 88 only allows transmission of certain frequency components of signals substantially matching the intermediate frequency (IF), which is realized by the aforementioned conversion circuit, while cutting out unwanted frequency components of signals. The reception mixer 89 performs mixing, using an output signal of the frequency synthesizer 92, on an output signal (i.e., an IF signal) of the reception filter 88. Herein, the frequency of the IF signal supplied to the reception mixer 89 is approximately set to 190 MHz, for example. The reception signal processing circuit 90 performs prescribed processing such as analog-to-digital conversion and demodulation processing on an output signal of the reception mixer 89. The receiver 91 is actualized by a small-size speaker and the like that transduces electric signals into sound waves, and it corresponds to the receiver 102 built in the portable telephone 100 shown in FIG. 9.

The frequency synthesizer 92 produces a first signal having a frequency of about 380 MHz to be supplied to the transmission mixer 82 and a second signal having a frequency of about 190 MHz to be supplied to the reception mixer 89. It comprises a PLL circuit that oscillates at a prescribed frequency, which is set to 760 MHz, for example. That is, the frequency synthesizer 92 divides the frequency of the output signal of the PLL circuit so as to produce the first signal whose frequency is 380 MHz and the second signal whose frequency is 190 MHz. The control circuit 93 controls the transmission signal processing circuit 81, the reception signal processing circuit 90, the frequency synthesizer 92, and the input/display circuit 94, thus controlling the overall operation of the portable telephone. The input/display circuit 94 controls the liquid crystal display 104 to display the status and other information on the screen of the portable telephone 100, which can be visually recognized by the user; and it also detects the user's manual operations conducted on the keypads 105 and the like of the portable telephone 100.

In the above, the aforementioned frequency filter shown in FIG. 3 is used for each of the transmission filter 83 and the reception filter 89. Herein, filtered frequencies (i.e., prescribed frequencies allowed to be transmitted) are respectively and specifically set to the transmission filter 83 and the reception filter 89. That is, a prescribed frequency (or a prescribed frequency band) is set to the transmission filter 83 to allow transmission of required frequency components within the output signal of the transmission mixer 82, while a prescribed frequency (or a prescribed frequency band) is set to the reception filter 88 to allow transmission of certain frequency components that are required for the reception mixer 89. Incidentally, the PLL circuit incorporated in the frequency synthesizer 92 comprises the aforementioned oscillator of FIG. 4 or the aforementioned oscillator (VCSO) shown in FIG. 5A and FIG. 5B or shown in FIG. 6, which may serve as the aforementioned VCO 74 arranged inside of the PLL circuit shown in FIG. 7.

6. Sixth Embodiment

FIG. 9 is a perspective view showing the exterior appearance of the portable telephone 100, which is an example of an electronic device in accordance with a sixth embodiment of the invention.

The portable telephone 100 comprises the antenna 101, the receiver 102, the transmitter 103, the liquid crystal display 104, and the keypads (or push buttons) 105.

As described above, the surface-acoustic-wave components, frequency filter, oscillators and their manufacturing methods, electronic circuit, and electronic device are described by way of various embodiments. Of course, this invention is not necessarily limited to the aforementioned embodiments and can be freely modified within the scope of the invention.

That is, the aforementioned portable telephone 100 is used as an example of the electronic device, and the aforementioned electronic circuit of FIG. 8 is used as an example of the electronic circuit. However, this invention is not necessarily applied to portable telephones and can be adapted to mobile communication devices and their electronic circuits internally arranged.

This invention can be adapted to so-called 'fixed-type' communication devices, which are fixed in position, such as tuners for receiving television signals from satellites (e.g., BS or CS broadcasting) as well as their built-in electronic circuits. In addition, this invention can be adapted to other communication devices using signals and waves propagating in the air as communication carriers. Furthermore, this invention can be adapted to other electronic devices, such as HUB, using high-frequency signals transmitted via coaxial cables and optical signals transmitted via optical cables as well as their built-in electronic circuits.

As described heretofore, this invention has a variety of effects and technical features, which will be described below.

(1) This invention provides a surface-acoustic-wave component comprising at least two types of piezoelectric layers which are laminated and sequentially formed on a substrate so as to actualize preferable orientation, regardless of the property of the piezoelectric layer(s) that is hardly oriented to directly suit the material of the substrate. This allows the manufacturer to adequately select preferred materials for piezoelectric layers, which contributes to an improvement of the electromechanical coupling coefficient ($K^2$). Thus, it is possible to produce the surface-acoustic-wave component having high performance.

(2) This invention provides a surface-acoustic-wave component in which a conductive layer and at least one piezoelectric layer are sequentially formed on a substrate so as to actualize preferable orientation, regardless of the property of the piezoelectric layer that is hardly oriented to directly suit the material of the substrate, whereby it is possible to adequately select a preferred material, actualizing an improvement of the electromechanical coupling coefficient ($K^2$), for the piezoelectric layer. Thus, it is possible to produce the surface-acoustic-wave component having high performance. Herein, the thickness of the piezoelectric layer can be noticeably reduced so as to bring a reduction of the time required for the formation of the surface-acoustic-wave component and a reduction of the amount of the material used for the piezoelectric layer.

(3) In the above, the piezoelectric layer is composed of a prescribed material having the hexagonal crystal structure, which is selected from among zinc oxide (ZnO), aluminum nitride (AlN), lithium tantalate ($LiTaO_3$), lithium niobate ($LiNbO_3$), and other substances expressed in the chemical formula of $LiNb_{1-x}Ta_xO_3$ (where $0<x<1$). Due to the appropriate selection of the material, it is possible to efficiently form the piezoelectric layer (or piezoelectric thin film) having the preferred orientation on or above the substrate; thus, it is possible to produce the surface-acoustic-wave component having high performance.

(4) The aforementioned conductive layer is composed of a prescribed material having the hexagonal crystal structure, which is zinc oxide (ZnO) of the electronic carrier type using oxygen deficiency. It is possible to efficiently form the conductive layer having the preferred orientation on or about the substrate; thus, it is possible to produce the surface-acoustic-wave component having high performance.

(5) Among the two types of piezoelectric layers laminated and formed on the substrate, the first piezoelectric layer directly formed on the substrate is composed of zinc oxide (ZnO). This allows the first piezoelectric layer (i.e., zinc oxide layer) having the preferred orientation to be formed on the substrate without being affected by the material of the substrate. In other words, it is possible to further broaden the range of materials that are selected for use in the formation of the second piezoelectric layer laminated on the first piezoelectric layer directly formed on the substrate.

(6) The aforementioned substrate is composed of silicon (Si) or other compound containing silicon. In other words, the material of the substrate is not necessarily limited to silicon, whereby the substrate can be formed using any type of silicon compound, which yields an expansion of used fields of the surface-acoustic-wave component having high performance.

(7) This invention provides a frequency filter comprising first and second electrodes, which are respectively formed on the piezoelectric layer or a protective layer formed on the piezoelectric layer of the aforementioned surface-acoustic-wave component. Herein, surface acoustic waves are caused to occur in the piezoelectric layer in response to electric signals applied to the first electrode, so that the second electrode converts them into electric signals while resonating at a specific frequency or in a specific frequency band. This frequency filter has a high electromechanical coupling coefficient, and it can actualize a relatively large frequency band.

(8) This invention provides an oscillator comprising first and second electrodes, which are respectively formed on the piezoelectric layer or a protective layer formed on the piezoelectric layer of the aforementioned surface-acoustic-wave component, as well as an oscillation circuit. Herein, electric signals are applied to the first electrode so as to cause surface acoustic waves in the piezoelectric layer, and the second electrode resonates with surface acoustic waves at a specific frequency or in a specific frequency band. The oscillation circuit is connected with the first electrode receiving electric signals. Since the piezoelectric layer of the surface-acoustic-wave component has a relatively high electromagnetic coupling coefficient, it is possible not to arrange an extension coil in the oscillator, which is therefore simplified in circuit constitution. In addition, the oscillation circuit comprises transistors, which can be integrated; therefore, it is possible to reduce the overall size of the oscillator.

(9) In the above, thin-film transistors (TFTs) can be used for the oscillator circuit. In this case, the material of the substrate on which transistors are formed is not necessarily limited to silicon; therefore, it is possible to easily actualize integration between the surface-acoustic-wave component and the oscillation circuit. In addition, it is possible to broaden the range of the constitution and layout of the substrate actualizing integration of circuit components.

(10) This invention provides an electronic circuit comprising the aforementioned oscillator and the (first) electrode for receiving electric signals from an electric signal providing element. This electronic circuit can actualize various functions, in which specific frequency components are selected from electric signals, electric signals are converted to specific frequency components, electric signals are adequately modulated or demodulated, and electric signals having a specific frequency or a specific frequency band are detected, for example. Since the piezoelectric layer of the surface-acoustic-wave component incorporated in the oscillator, which is arranged inside of the electronic circuit, has a relatively high electromagnetic coupling coefficient, it is possible to actualize integration between the electronic circuit and the oscillation circuit; therefore, it is possible to provide a small-size and high-performance electronic device.

(11) This invention provides an electronic device comprising at least one of the aforementioned frequency filter, oscillator, and electronic circuit. Since the piezoelectric layer of the surface-acoustic-wave component has a relatively high electromechanical coupling coefficient, it is possible to provide a small-size and high-performance electronic device.

(12) This invention provides a manufacturing method of the aforementioned oscillator comprising the surface-acoustic-wave component and oscillation circuit. This manufacturing method comprises three steps, wherein the surface-acoustic-wave component is formed on a first substrate; thin-film transistors (TFTs) are formed on a second substrate; and thin-film transistors are transferred onto the first substrate so as to form the oscillation circuit. Herein, it is possible to easily actualize integration between the surface-acoustic-wave component and TFTs. In addition, this method is advantageous in that even though the first substrate is made of the material having a difficulty in directly forming TFTs thereon or the material not suited for formation of TFTs thereon, TFTs can be securely and reliably arranged on the first substrate by use of transfer.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A surface-acoustic-wave component comprising:

a substrate;

a conductive layer formed on the substrate; and at least one piezoelectric layer formed on the conductive layer;

wherein the conductive layer is composed of a prescribed material having a hexagonal crystal structure, and wherein the prescribed material is zinc oxide of an electronic carrier type realized by oxygen deficiency.

2. A surface-acoustic-wave component according to claim 1, wherein the substrate is composed of silicon or a compound containing silicon.

3. A surface-acoustic-wave component according to claim 1, wherein the at least one piezoelectric layer is composed of a prescribed material having a hexagonal crystal structure.

4. A surface-acoustic-wave component according to claim 3, wherein the prescribed material composing the piezoelectric layer is selected from among zinc oxide, aluminum nitride, lithium tantalate, lithium niobate, and other substance expressed by a chemical formula of $LiNb_{1-x}Ta_xO_3$ (where $0<x<1$).

5. A frequency filter comprising:

a surface-acoustic-wave component comprising a conductive layer and a piezoelectric layer sequentially on a substrate;

a first electrode formed on the piezoelectric layer or a protective layer formed on the piezoelectric layer; and a second electrode formed on the piezoelectric layer or a protective layer formed on the piezoelectric layer, wherein the second electrode resonates at a specific frequency or a specific frequency band of surface acoustic waves, which occur in the piezoelectric layer in response to input signals applied to the first electrode, so as to convert the surface acoustic waves into electric signals;

wherein the conductive layer is composed of a prescribed material having a hexagonal crystal structure, which is zinc oxide of an electronic carrier type realized by oxygen deficiency.

6. A frequency filter according to claim 5, wherein the piezoelectric layer is composed of a prescribed material having a hexagonal crystal structure, which is selected from among zinc oxide, aluminum nitride, lithium tantalate, lithium niobate, and other substance expressed by a chemical formula of $LiNb_{1-x}Ta_xO_3$ (where 0<x<1).

7. A frequency filter according to claim 5, wherein the substrate is composed of silicon or a compound containing silicon.

8. An electronic device comprising a frequency filter according to any one of claims 5 to 7.

9. An oscillator comprising:

a surface-acoustic-wave component comprising first and second piezoelectric layers sequentially on a substrate;

an electrode formed on the second piezoelectric layer or a protective layer formed on the second piezoelectric layer, wherein the electrode causes surface acoustic waves in the second piezoelectric layer in response to electric signals applied thereto;

a resonating electrode formed on the second piezoelectric layer or a protective layer formed on the second piezoelectric layer, wherein the resonating electrode resonates a specific frequency component or a specific frequency-band component of the surface acoustic waves that occur in the second piezoelectric layer; and an oscillation circuit connected with the electrode for receiving the electric signals;

wherein the oscillation circuit comprises a plurality of thin-film transistors.

10. An oscillator according to claim 9, wherein at least one of the first and second piezoelectric layers is composed of a prescribed material having a hexagonal crystal structure, which is selected from among zinc oxide, aluminum nitride, lithium tantalate, lithium niobate, and other substances expressed by a chemical formula of $LiNb_{1-x}TaO_3$ (where0<x<1).

11. An oscillator according to claim 9, wherein the substrate is composed of silicon or a compound containing silicon.

12. An oscillator comprising:

a surface-acoustic-wave component comprising a conductive layer and a piezoelectric layer sequentially on a substrate;

an electrode formed on the piezoelectric layer or a protective layer formed on the piezoelectric layer, wherein the electrode causes surface acoustic waves in the piezoelectric layer in response to electric signals applied thereto;

a resonating electrode formed on the piezoelectric layer or a protective layer formed on the piezoelectric layer, wherein the resonating electrode resonates a specific frequency component or a specific frequency-band component of the surface acoustic waves that occur in the piezoelectric layer; and an oscillation circuit connected with the electrode for receiving the electric signals;

wherein the oscillation circuit comprises a plurality of thin-film transistors.

13. An oscillator according to claim 12, wherein the piezoelectric layer is composed of a prescribed material having a hexagonal crystal structure, which is selected from among zinc oxide, aluminum nitride, lithium tantalate, lithium niobate, and other substance expressed by a chemical formula of $LiNb_{1-x}TaO_3$ (where0<x<1).

14. An oscillator according to claim 12, wherein the substrate is composed of silicon or a compound containing silicon.

15. An oscillator comprising:

a surface-acoustic-wave component comprising a conductive layer and a piezoelectric layer sequentially on a substrate:

an electrode formed on the piezoelectric layer or a protective layer formed on the piezoelectric layer, wherein the electrode causes surface acoustic waves in the piezoelectric layer in response to electric signals applied thereto;

a resonating electrode formed on the piezoelectric layer or a protective layer formed on the piezoelectric layer, wherein the resonating electrode resonates a specific frequency component or a specific frequency-band component of the surface acoustic waves that occur in the piezoelectric layer; and an oscillation circuit connected with the electrode for receiving the electric signals, wherein the conductive layer is composed of a prescribed material having a hexagonal crystal structure, which is zinc oxide of an electronic carrier type realized by oxygen deficiency.

16. An electronic device comprising an oscillator according to any one of claims 9, 10 to 12, and 13 to 15.

17. An electronic circuit comprising:

an oscillator, which comprises a surface-acoustic-wave component including first and second piezoelectric layers sequentially on a substrate, an electrode formed on the second piezoelectric layer or a protective layer formed on the second piezoelectric layer, a resonating electrode formed on the second piezoelectric layer or a protective layer formed on the second piezoelectric layer, and an oscillation circuit connected with the electrode, wherein the resonating electrode resonates a specific frequency component or a specific frequency-band component of surface acoustic waves that are caused to occur in the second piezoelectric layer in response to electric signals applied to the electrode; and an electric signal providing element for providing the electrode with the electric signals, whereby specific frequency components are selected from the electric signals, or whereby the electric signals are converted to specific frequency components, or whereby the electric signals are modulated or demodulated, or whereby the electric signals are detected;

wherein the oscillation circuit comprises a plurality of thin-film transistors.

18. An electronic circuit comprising:

an oscillator, which comprises a surface-acoustic-wave component including a conductive layer and a piezoelectric layer sequentially on a substrate, an electrode formed on the piezoelectric layer or a protective layer formed on the piezoelectric layer, a resonating electrode formed on the piezoelectric layer or a protective layer formed on the piezoelectric layer, and an oscillation circuit connected with the electrode, wherein the resonating electrode resonates at a specific frequency component or a specific frequency-band component of surface acoustic waves that are caused to occur in the piezoelectric layer in response to electric signals applied to the electrode; and an electric signal providing element for providing the electrode with the electric signals, whereby specific frequency components are selected from the electric signals, or whereby the electric signals are converted to specific frequency components, or whereby the electric signals are modulated or demodulated, or whereby the electric signals are detected;

wherein the oscillation circuit comprises a plurality of thin-film transistors.

19. An electronic circuit according to claim 17 or 18, wherein at least one piezoelectric layer is composed of a prescribed material having a hexagonal crystal structure, which is selected from among zinc oxide, aluminum nitride, lithium tantalate, lithium niobate, and other substance expressed by a chemical formula of $LiNb_{1-x}TaO_3$ (where $0<x<1$).

20. An electronic circuit according to claim 17 or 18, wherein the substrate is composed of silicon or a compound containing silicon.

21. An electronic device comprising an electronic circuit according to claim 17 or 18.

22. An electronic circuit comprising:

an oscillator, which comprises a surface-acoustic-wave component including a conductive layer and a piezoelectric layer sequentially on a substrate, an electrode formed on the piezoelectric layer or a protective layer formed on the piezoelectric layer, a resonating electrode formed on the piezoelectric layer or a protective layer formed on the piezoelectric layer, and an oscillation circuit connected with the electrode, wherein the resonating electrode resonates at a specific frequency component or a specific frequency-band component of surface acoustic waves that are caused to occur in the piezoelectric layer in response to electric signals applied to the electrode; and an electric signal providing element for providing the electrode with the electric signals, whereby specific frequency components are selected from the electric signals, or whereby the electric signals are converted to specific frequency components, or whereby the electric signals are modulated or demodulated, or whereby the electric signals are detected, wherein the conductive layer is composed of a prescribed material having a hexagonal crystal structure, which is zinc oxide of an electronic carrier type realized by oxygen deficiency.

23. A manufacturing method for an oscillator comprising a surface-acoustic-wave component and an oscillation circuit, comprising the steps of:

forming the surface-acoustic-wave component on a first substrate;

forming thin-film transistors on a second substrate; and transferring the thin-film transistors from the second substrate to the first substrate, thus forming the oscillation circuit.

24. The manufacturing method for an oscillator according to claim 23 wherein the surface-acoustic-wave component comprises at least two piezoelectric layers sequentially formed on the first substrate.

25. The manufacturing method for an oscillator according to claim 23, wherein the surface-acoustic-wave component comprises a conductive layer and a piezoelectric layer sequentially formed on the first substrate.

26. The manufacturing method for an oscillator according to claim 25, wherein the conductive layer is composed of a prescribed material having a hexagonal crystal structure, which is zinc oxide of an electronic carrier type realized by oxygen deficiency.

27. The manufacturing method for an oscillator according to claim 24 or 25, wherein at least one piezoelectric layer is composed of a prescribed material having a hexagonal crystal structure, which is selected from among zinc oxide, aluminum nitride, lithium tantalate, lithium niobate, and other substance expressed by a chemical formula of $LiNb_{1-x}Ta_xO_3$ (where $0<x<1$).

28. The manufacturing method for an oscillator according to claim 24 or 25, wherein the substrate is composed of silicon or a compound containing silicon.

29. The manufacturing method for an oscillator according to claim 24 or 25, wherein the oscillator further comprises an electrode formed on the piezoelectric layer or a protective layer formed on the piezoelectric layer, and a resonating electrode formed on the piezoelectric layer or a protective layer formed on the piezoelectric layer, whereby the resonating electrode resonates at a specific frequency component or a specific frequency-band component of surface acoustic waves that are caused to occur in the piezoelectric layer in response to electric signals applied to the electrode.

* * * * *

UNITED STATES PATENT AND TRADEMARK OFFICE

CERTIFICATE OF CORRECTION

PATENT NO. : 6,995,634 B2
APPLICATION NO. : 10/753237
DATED : February 7, 2006

INVENTOR(S) : Setsuya Iwashita, Takamitsu Higuchi and Hiromu Miyazawa

It is certified that error appears in the above-identified patent and that said Letters Patent is hereby corrected as shown below:

Column 5, Line 44: "AIN" should be --A1N--

Column 5, Line 46: "AIN" should be --A1N--

Column 17, Line 31: "$LiNb_{1-x}TaO_3$" should be --$LiNb_{1-x}Ta_xO_3$--

Column 18, Lines 38-39: "$LiNb_{1-}xTa_xO_3$" should be --$LiNb_{1-x}Ta_xO_3$--

Signed and Sealed this

Twelfth Day of December, 2006

JON W. DUDAS
*Director of the United States Patent and Trademark Office*